US008787862B2

(12) United States Patent
Kaukovuori et al.

(10) Patent No.: US 8,787,862 B2
(45) Date of Patent: *Jul. 22, 2014

(54) METHOD OF RECEIVING AND RECEIVERS

(71) Applicant: Broadcom Corporation, Irvine, CA (US)

(72) Inventors: Jouni Kristian Kaukovuori, Vantaa (FI); Aarno Tapio Parssinen, Espoo (FI); Antti Oskari Immonen, Helsinki (FI)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/677,866

(22) Filed: Nov. 15, 2012

(65) Prior Publication Data

US 2013/0130637 A1 May 23, 2013

Related U.S. Application Data

(63) Continuation-in-part of application No. 13/299,880, filed on Nov. 18, 2011.

(30) Foreign Application Priority Data

Nov. 17, 2011 (GB) .................................. 1119887.6
Nov. 1, 2012 (GB) .................................. 1219626.7

(51) Int. Cl.
*H04B 1/26* (2006.01)
*H04M 1/00* (2006.01)

(52) U.S. Cl.
USPC .......... 455/313; 455/323; 455/334; 455/552.1

(58) Field of Classification Search
USPC .................. 455/132–135, 140–143, 266, 455/552.1–553.1, 313, 323–324, 334
See application file for complete search history.

(56) References Cited

U.S. PATENT DOCUMENTS 6,356,746 B1  3/2002  Katayama
6,785,529 B2  8/2004  Ciccarelli et al.
(Continued)

FOREIGN PATENT DOCUMENTS

EP  2 141 818 A1  1/2010
EP  2 378 670 A2  10/2011
(Continued)

OTHER PUBLICATIONS

ZTE, "Handling the Interferences in the NC_GAP in NC_4CHSDPA", 3GPP Draft R4-113494, TSG-RAN Working Group 4 (Radio) Meeting #59AH, Bucharest, Romania, Jun. 27-Jul. 1, 2011 (3 pages).

(Continued)

*Primary Examiner* — Simon Nguyen
(74) *Attorney, Agent, or Firm* — Foley & Lardner LLP

(57) ABSTRACT

A receiver uses a local oscillator to receive data transmitted via a combination of radio frequency signals using carrier aggregation. Each radio frequency signal occupies a respective radio frequency band and the radio frequency bands are arranged in two groups, a first group and a second group, separated in frequency by a first frequency region, each of the groups including one or more radio frequency bands and the first group occupying a wider frequency region than the second group. The radio frequency signals are processed using the local oscillator by setting the local oscillator, during the processing, to a frequency that is offset from the center of a band defined by outer edges of the frequency regions occupied by the two groups.

21 Claims, 16 Drawing Sheets

(56) References Cited

U.S. PATENT DOCUMENTS

| | | | |
|---|---|---|---|
| 7,457,605 B2 | 11/2008 | Thompson et al. | |
| 7,477,885 B2 | 1/2009 | Rostami et al. | |
| 7,504,890 B2 | 3/2009 | Citta et al. | |
| 7,526,052 B2 | 4/2009 | Davidoff et al. | |
| 7,567,786 B2 | 7/2009 | Bjerede | |
| 7,783,275 B2 | 8/2010 | Wakayama et al. | |
| 8,014,466 B2 | 9/2011 | Min et al. | |
| 8,275,338 B2 | 9/2012 | Papananos | |
| 8,320,858 B2 | 11/2012 | Ruelke et al. | |
| 8,442,473 B1* | 5/2013 | Kaukovuori et al. | 455/323 |
| 8,565,700 B2* | 10/2013 | Lee | 455/132 |
| 2003/0138032 A1 | 7/2003 | Shi et al. | |
| 2004/0224654 A1 | 11/2004 | Javor et al. | |
| 2007/0211837 A1 | 9/2007 | Zipper | |
| 2008/0112470 A1 | 5/2008 | Cleveland et al. | |
| 2010/0104001 A1* | 4/2010 | Lee et al. | 375/240 |
| 2010/0118923 A1 | 5/2010 | Pal | |
| 2010/0210272 A1 | 8/2010 | Sundström et al. | |
| 2010/0261443 A1* | 10/2010 | Walley et al. | 455/118 |
| 2011/0268232 A1 | 11/2011 | Park et al. | |
| 2013/0266092 A1* | 10/2013 | Sugar et al. | 375/340 |

FOREIGN PATENT DOCUMENTS

| | | |
|---|---|---|
| WO | WO 00/11794 A1 | 3/2000 |
| WO | WO 2010/092167 A1 | 8/2010 |
| WO | WO 2010/129584 A1 | 11/2010 |
| WO | WO 2013/024450 A1 | 2/2013 |

OTHER PUBLICATIONS

ST-Ericsson/Ericsson, "Non-Contiguous Carrier Aggregation Configurations", 3GPP Draft R4-113595, TSG RAN WG4 Meeting #59AH, Bucharest, Romania, Jun. 27-Jul. 1, 2011 (5 pages).

UKIPO Combined Search and Examination Report under Section 17 and 18(3) dated Sep. 24, 2012 which is issued in a related British Application No. GB1215802.8 (5 pages).

Ericsson, 3GPP TSG-RAN Meeting #51, RP-110416, Kansas City, Missouri, USA Mar. 15-18, 2011, "Non-Contiguous 4C-HSDPA Operation, Core-Part, 4C Performance Part" (13 pages).

Nokia Corporation, 3GPP TSG-RAN Meeting #52, RP-110732, Bratislava, Slovakia, May 31, Jun. 3, 2011, "LTE Carrier Aggregation Enhancements, Core-Part, Performance" (17 pages).

Ericsson, 3GPP TSG-RAN Meeting #60, Tdoc R4-114401, Athens, Greece, Aug. 22, 26, 2011, "Feedback on non contiguous carrier aggregation feasibility," (2 pages).

Renesas Electronics Europe, 3GPP TSG-RAN WG4 Meeting #58, R4-111965, Shanghai, China, Apr. 10-15, 2011, "Considerations on RSTD measures and carrier aggregation," (9 pages).

Ericsson, 3GPP TSG-RAN WG4 Meeting #61, R4-115583, San Francisco, California, Nov. 14-18, 2011, "Scenarios for non-continuous intra-band CA," (7 pages).

Notice of Allowance mailed Feb. 22, 2013 issued in a related U.S. Appl. No. 13/300,004 (16 pages).

Non-Final Office Action dated Feb. 28, 2013 issued in a related U.S. Appl. No. 13/677,776 (12 pages).

UKIPO Combined Search and Examination Report under Sections 17 and 18(3) dated Mar. 15, 2012 issued in a related British Application No. GB1119887.6 (5 pages).

UKIPO Combined Search and Examination Report under Sections 17 and 18(3) dated Mar. 19, 2012 issued in a related British Application No. GB1119888.4 (5 pages).

UKIPO Combined Search and Examination Report under Sections 17 and 18(3) dated Dec. 7, 2012 issued in a related British Application No. GB1219626.7 (6 pages).

PCT Notification of Transmittal of the International Search Report and the Written Opinion and PCT International Search Report, PCT Written Opinion mailed Feb. 25, 2013 issued in a related PCT Application No. PCT/IB2012/056441 (15 pages).

Notice of Allowance dated Apr. 26, 2013, which is issued in a related U.S. Appl. No. 13/677,776, filed Nov. 15, 2012 (11 pages).

Pietro Andreani, et al., "A CMOS $g_m$-C Polyphase Filter with High Image Band Rejection," Solid-State Circuits Conference, 2000, Proceedings of the 26 Round European, IEEE, pp. 272-275, XP031952366 (4 pages).

Nokia et al., 3GPP TSG-RAN WG4 Meeting 2010 AH#4, R4-103677, Xi'an, :China, Oct. 11-15, 2010, "Image Rejection in intraband carrier aggregation" (8 pages).

Toru Kitayabu et al., "Concurrent Dual-Band Receiver for Spectrum Aggregation System," Radio and Wireless Symposium, 2009, RWS 2009, IEEE, Piscataway, NJ, USA, pp. 634-637 XP031457487 (4 pages).

PCT Notification of Transmittal of the International Search Report and the Written Opinion and PCT International Search Report, PCT Written Opinion mailed Mar. 13, 2013, all of which was issued in a related PCT Application No. PCT/IB2012/056440 (15 pages).

3GPP TS 25.101 (see Table 7.2C), User Equipment (UE) radio transmission and reception (FDD) Specification Detail (4 pages), Printout generated Feb. 21, 2013, Available on-line: http://www.3gpp.org/ftp/specs/html-info/25101.htm.

* cited by examiner

METHOD OF RECEIVING AND RECEIVERS

CROSS REFERENCE TO RELATED APPLICATION

This is a Continuation-In-Part of U.S. patent application Ser. No. 13/299,880, filed Nov. 18, 2011, and claims the benefit under 35 U.S.C. §119(a) and 37 CFR §1.55 to UK Patent Application No. 1119887.6 filed on Nov. 17, 2011, and to UK Patent Application No, 1219626.7 filed on Nov. 1, 2012, the entire disclosure of each of which is incorporated herein by reference.

TECHNICAL FIELD

The present invention relates to methods of receiving and receivers for radio communication systems, and in particular, but not exclusively, to non-contiguous carrier aggregation schemes.

BACKGROUND INFORMATION

Long Term Evolution (LTE) Advanced is a mobile telecommunication standard proposed by the 3 Generation Partnership Project (3GPP®) and first standardised in 3GPP Release 10. In order to provide the peak bandwidth requirements of a $4^{th}$ Generation system as defined by the International Telecommunication Union Radiocommunication (ITU-R) Sector, while maintaining compatibility with legacy mobile communication equipment, LTE Advanced proposes the aggregation of multiple carrier signals in order to provide a higher aggregate bandwidth than would be available if transmitting via a single carrier signal. This technique of Carrier Aggregation (CA) requires each utilised carrier signal to be demodulated at the receiver, whereafter the message data from each of the signals can be combined in order to reconstruct the original data. Carrier Aggregation can be used also in other radio communication protocols such as High Speed Packet Access (HSPA).

Carrier signals are typically composed of a carrier frequency that is modulated to occupy a respective radio frequency carrier signal band. Contiguous Carrier Aggregation involves aggregation of carrier signals that occupy contiguous radio frequency carrier signal bands. Contiguous radio frequency carrier signal bands may be separated by guard bands, which are small unused sections of the frequency spectrum designed to improve the ease with which individual signals can be selected by filters at the receiver by reducing the likelihood of interference between signals transmitted in adjacent bands. Non-contiguous Carrier Aggregation includes aggregation of carrier signals that occupy non-contiguous radio frequency carrier signal bands, and may include aggregation of clusters of one or more contiguous carrier signals. The non-contiguous radio frequency carrier signal bands are typically separated by a frequency region which is not available to the operator of the network including the carrier signals, and may be allocated to another operator. This situation is potentially problematic for the reception of the carrier signals, since there may be signals in the frequency region that separates the non-contiguous carriers which are at a higher power level than the wanted carrier signals.

A Direct Conversion Receiver (DCR) is typically employed to receive cellular radio signals, and typically provides an economical and power efficient implementation of a receiver, A DCR uses a local oscillator placed within the radio frequency bandwidth occupied by the signals to be received to directly convert the signals to baseband. Signals on the high side of the local oscillator are mixed to the same baseband frequency band as signals on the low side of the local oscillator, and in order to separate out the high and low side signals, it is necessary to mix the signal with two components of the local oscillator in quadrature (i.e. 90 degrees out of phase with one another) to produce inphase (I) and quadrature (Q) signal components at baseband. The I and Q components are digitised separately, and may be processed digitally to reconstruct the separate high side and low side signals. The reconstructed high and low side signals may be filtered in the digital domain to separate carrier signals received within the receiver bandwidth of the DCR.

The presence of a higher power signal in the region separating non-contiguous carrier clusters poses particular problems if a DCR is to be used to receive a band of frequencies including non-contiguous Carrier Aggregation signals, in particular, since the higher power signal is within the receiver bandwidth, the dynamic range of the receiver need to encompass the powers of the wanted carrier signals, which are typically received at a similar power to each other, and the higher power signal. This may place severe demands on the dynamic range of the analogue to digital converter (A/D) in particular. Furthermore, due to inevitable imbalances between the amplitudes and phases of the I and Q channels, the process of reconstructing the separate high side and low side signals suffers from a limited degree of cancellation of the image component; that is to say, some of the high side signals break through onto the reconstructed low side signals, and vice versa. The degree of rejection of the image signal may be termed the Image Reject Ratio (IRR). If the higher power signal is a high side signal, it may cause interference to received low side signals due to the finite IIR, and similarly if the higher power signal is a low side signal, it may cause interference to received high side signals.

One conventional method of receiving Non-contiguous Carrier Aggregation signals is to provide two DCR receiver stages, each having a local oscillator tuned to receive a cluster of contiguous carriers, and so rejecting signals in the frequency region between the clusters before digitisation. However, this approach is potentially expensive and power consuming, and may suffer from interference between the closely spaced local oscillators.

It is an object of the invention to address at least some of the limitations of the prior art systems.

SUMMARY

In accordance with a first exemplary embodiment of the present invention, there is provided a method of receiving, using a local oscillator, data transmitted via a combination of at least a plurality of radio frequency signals using carrier aggregation, the method including:

processing at least said plurality of radio frequency signals using said local oscillator, each radio frequency signal occupying a respective band of a plurality of radio frequency bands, the plurality of radio frequency bands being arranged in two groups, a first group and a second group, separated in frequency by a first frequency region, each of the groups including one or more radio frequency bands and the first group occupying a wider frequency region than the second group; and setting said local oscillator, during said processing, to a frequency that is offset from the centre of a band defined by outer edges of the frequency regions occupied by the two groups, wherein the frequency to which the local oscillator is set is within one quarter of the bandwidth of one of the plurality of radio frequency bands from a frequency mid-way between the centre of the frequency region occupied by the first group and the centre of the frequency region occupied by the second group.

In accordance with a second exemplary embodiment of the present invention, there is provided a receiver for receiving data transmitted via a combination of at least a plurality of radio frequency signals using carrier aggregation, each radio frequency signal occupying a respective band of a plurality of radio frequency bands, the plurality of radio frequency bands being arranged in two groups separated in frequency by a first frequency region, the first, of the two groups occupying a wider frequency region than the second group, the receiver including:

a controller configured to determine a frequency that is offset from the centre of a band defined by outer edges of the frequency regions occupied by the two groups; and a signal processor for processing said plurality of radio frequency signals using a local oscillator set to the determined frequency.

Specific embodiments of the invention are defined in the dependent claims.

Further features and advantages of the invention will be apparent from the following description of preferred embodiments of the invention, which are given by way of example only.

BRIEF DESCRIPTION OF THE DRAWINGS

FIG. 23 (lower part) is schematic diagram showing a receiver architecture having real filters and a digital data path having image reject mixing.

DETAILED DESCRIPTION

By way of example an embodiment of the invention will now be described in the context of a wireless communications system supporting communication using E-UTRA radio access technology, as associated with E-UTRAN radio access networks in LTE systems. However, it will be understood that this is by way of example only and that other embodiments may involve wireless networks using other radio access technologies, such as UTRAN, GERAN or IEEE802.16 WiMax systems.

Figure 1:
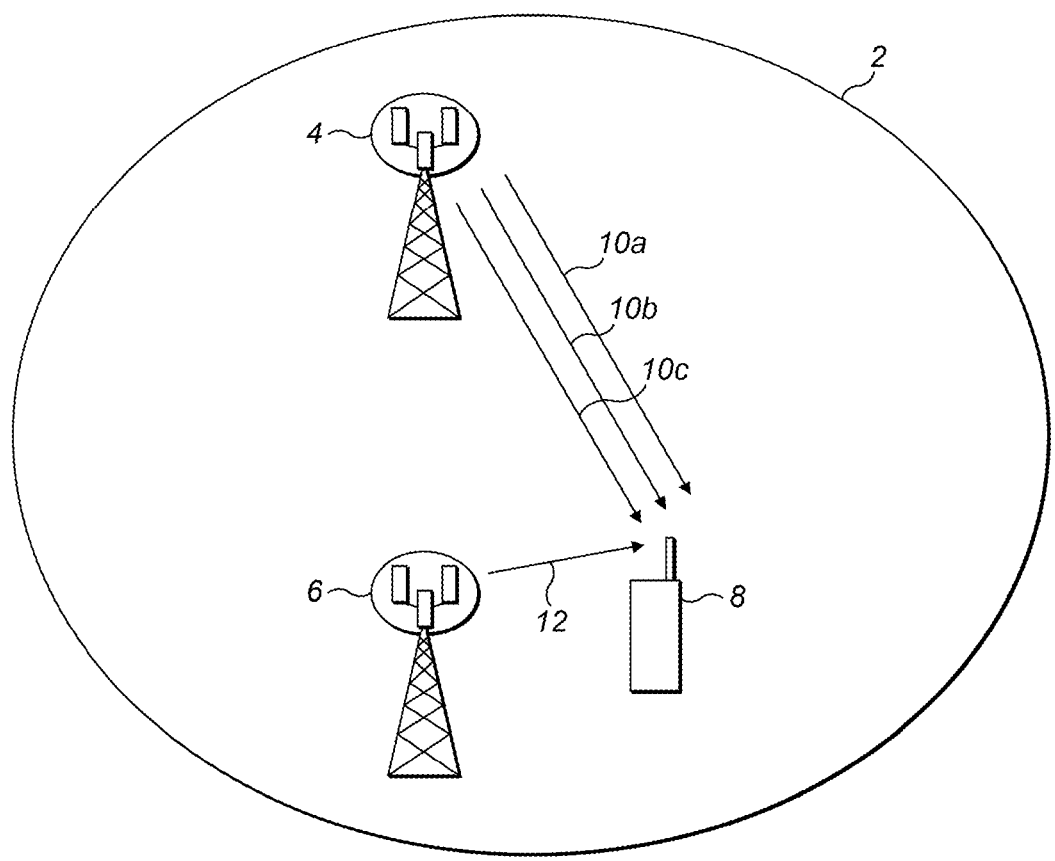
FIG. 1 is a schematic diagram showing the transmission of carrier aggregation signals by the radio access network of a first operator and transmission of a signal from another a radio access network.
Figure 2:
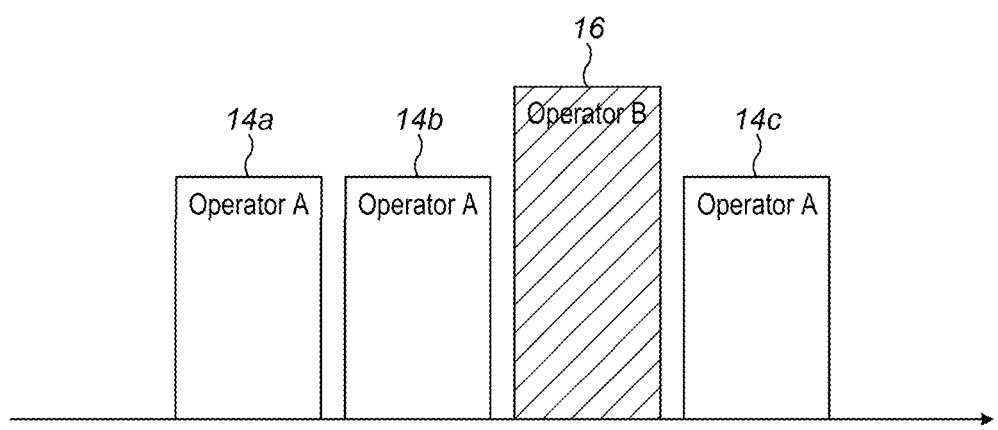
FIG. 2 is amplitude-frequency diagram showing carriers in a non-contiguous carrier aggregation method and a carrier from another operator received at a higher level.

FIG. 1 shows the transmission of radio frequency signal signals 10a, 10b and 10c by the radio access network to a receiver 8. The radio frequency signals each occupy a respective carrier signal band, as shown in the amplitude-frequency diagram of FIG. 2. A carrier signal band is the part of the radio frequency spectrum occupied by a modulated radio frequency carrier including the radio frequency signal. Radio frequency signals 10a, 10b, and 10c occupy radio frequency bands 14a, 14b and 14c as shown in FIG. 2. Data is received using the combination of the radio frequency signals 10a, 10b and 10c, and the bands 14a, 14b and 14c shown in FIG. 2 represent a set of radio frequency signals, that may be referred to as component carriers, transmitted using Carrier Aggregation. It can be seen from FIG. 2 that non-contiguous Carrier Aggregation is used, since a radio frequency signal from another operator, other than the operator sending the data, is present in a frequency region separating bands 14b and 14c. In FIG. 1, the radio frequency signals are sent from a first base station 4, operated by Operator A. A second base station 6, operated by a different operator, Operator B, is situated within the area of coverage 2 of the first base station 4, and transmits a radio frequency signal 12 that is receive by the user equipment 8. It can be seen that the second base station is closer to the user equipment 8 than is the first base station. As a result, it can be seen from FIG. 2 that the radio frequency signal is received at the user equipment 8 at a significantly higher power level, as shown by the amplitude of the band 16 transmitted by operator B.

Figure 3:
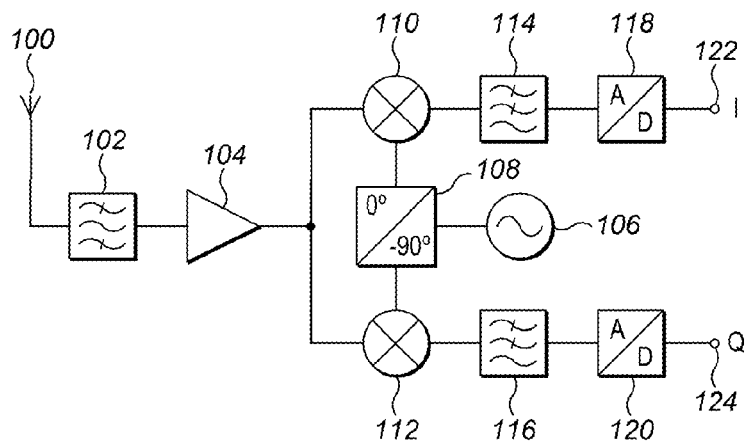
FIG. 3 is a schematic diagram showing a conventional direct conversion receiver.

FIG. 3 is a schematic diagram showing a conventional direct conversion receiver. A signal is received by an antenna 100, and filtered by a front end filter 102, which removes out of band signals, protecting the Low Noise Amplifier (INA) 1.04 from saturation by strong out of band signals. A local oscillator 106 is typically set to a frequency in the centre of a desired radio frequency (RF) band. RF signals that are both higher than (high side) and lower than (low side) the local oscillator frequency are mixed with the local oscillator to downconvert the RF signals to baseband frequencies, which are the difference between the RF and local oscillator frequencies. These difference frequencies, for signals within an intended receive band, are arranged to fall within the passband of the low pass filters 114, 116 of the direct conversion receiver. In order to distinguish between RF signals that originated on the high side of the local oscillator and RF signals that originated on the high side of the local oscillator, it is necessary to mix the RF signal with two components of the local oscillator which are in quadrature (i.e. 90 degrees out of phase with one another) to produce inphase (I) and quadrature (Q) signal components at baseband. As shown in FIG. 3, the local oscillator is split into 0 and –90 degree components in a splitter 108 and each component is mixed with the incoming RF signal in a respective mixer 110, 112. The I and Q components are separately filtered low pass filtered, and each filtered signal is converted to the digital domain in an Analogue to digital converter (A/D) 118, 120, to produce a data stream with I and Q components 122, 124. The I and Q components may be processed digitally to reconstruct the separate high side and low side signals. The reconstructed high and low side signals may be filtered in the digital domain to separate carrier signals received within the receiver bandwidth of the DCR. However, as already mentioned, due to imbalances between the amplitudes and phases of the I and Q channels, the process of reconstructing the separate high side and low side signals suffers from a limited degree of cancellation of the image component, so that some of the high side signals break through onto the reconstructed low side signals, and vice versa. The degree of rejection of the image signal may be termed the Image Reject Ratio (IRR).

Figure 4:
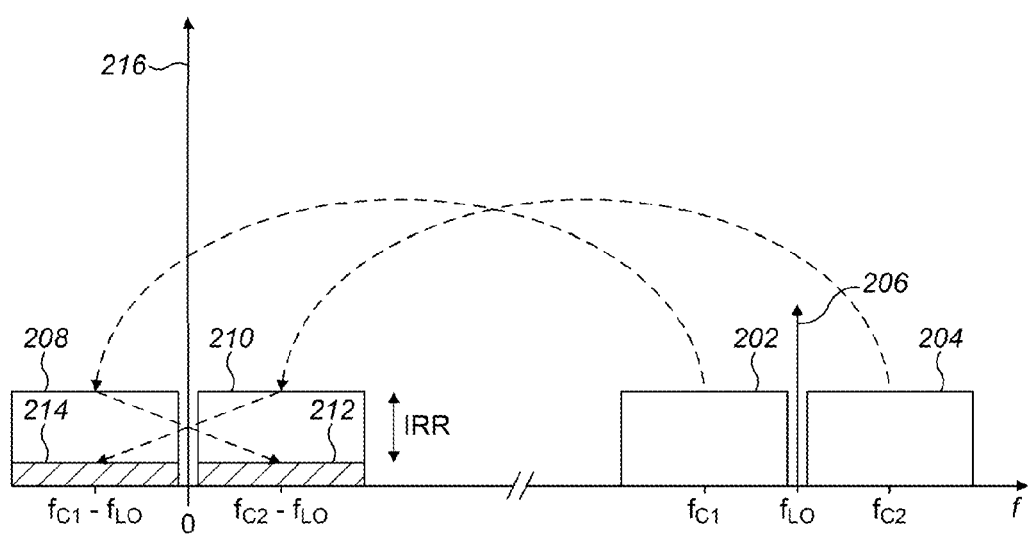
FIG. 4 is a diagram illustrating an effect of a finite image rejection ratio in a direct conversion receiver.

FIG. 4 shows the effect of a finite image rejection ratio in a direct conversion receiver, in the case where two bands 202, 204 are received at approximately the same power level at radio frequency. As can be seen, the two bands are mixed with a local oscillator 206 and downconverted to a band encompassing zero frequency, which may be referred to as DC (Direct Current). In FIG. 4, the high side signal 204 is shown as being downconverted to positive frequency 210, and the low side signal 202 is shown as being downconverted to a negative frequency 208. This is a matter of convention, and the designation of positive and negative frequencies may be transposed. The concept of positive and negative frequencies has meaning only within the complex signal domain, in which signals are represented by I and Q components. A negative frequency has a phasor defined by its I and Q components that rotates in the opposite direction to the phasor of a positive frequency. By distinguishing between positive and negative frequencies by signal processing, for example using a Fast Fourier Transform (FFT) or a complex digital mixer, signals originating as high side RF signals may be separately received from signals originating as low side RF signals. So, as shown in FIG. 4, data may be extracted from two received carrier signal bands, provided that the signal to noise ratio (SNR) is not degraded unacceptably by the image component 214 of the high side signal 204 that is in the same band 208 as the downconverted low side signal 202, and the image component 212 of the low side signal 202 that is in the same band 210 as the downconverted high side signal 204. For signals received at approximately the same power level, SNR is not usually degraded unacceptably by the finite image reject ratio.

Figure 5:
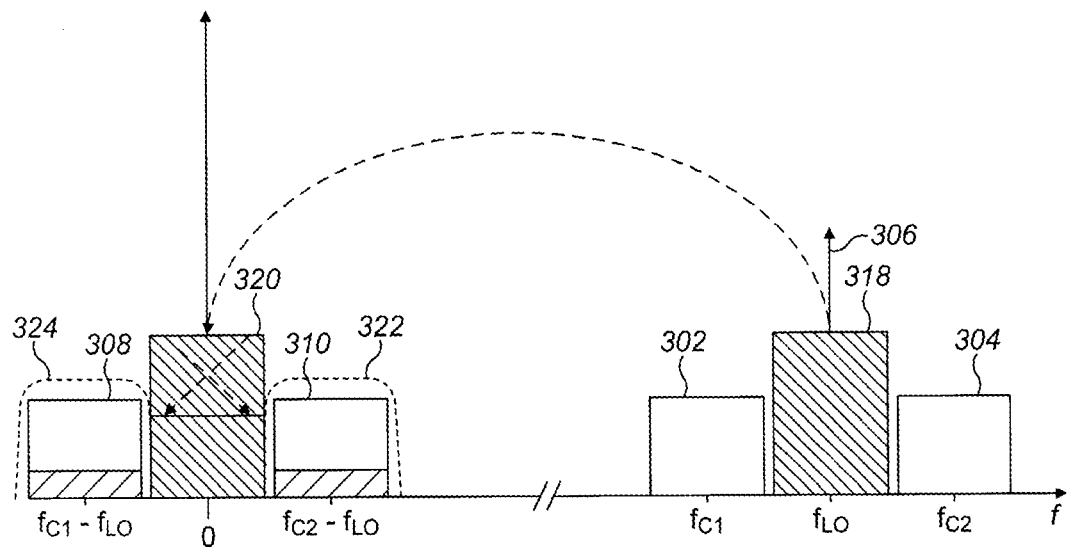
FIG. 5 is a diagram illustrating reception of non-contiguous aggregated carriers in a low IF receiver.

FIG. 5 is a diagram illustrating reception of non-contiguous aggregated carriers. In this example, wanted component signal bands 302 and 304 are separated by a higher power radio frequency signal 318, which may originate from another operator. As can be seen from FIG. 5, a local oscillator 306 may be placed in the middle of a receive band defined by the three component signal bands 302, 304, 318. As can be seen from FIG. 5, images of the higher power radio frequency signal resulting from the finite image reject ratio do not fall on top of the downconverted weaker signals in this case, but fall within the downconverted components 320 of the higher power radio frequency signal.

Figure 6:
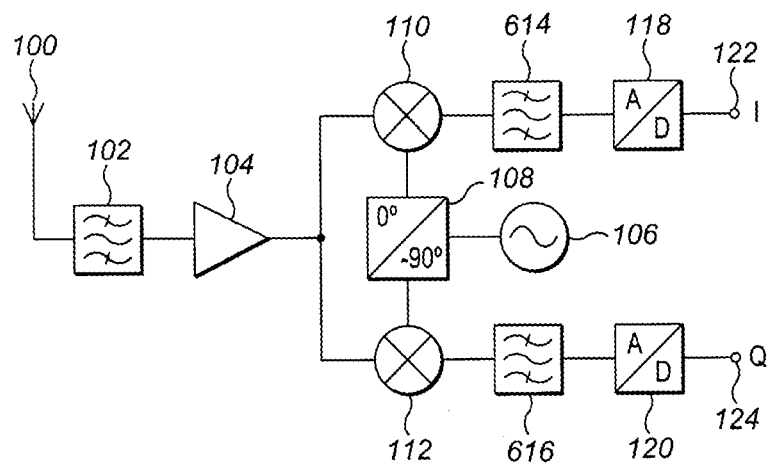
FIG. 6 is a schematic diagram showing a conventional low IF receiver.

FIG. 6 is a schematic diagram showing a conventional low IF receiver that may be used to receive the signals illustrated in FIG. 5. It can be seen that the low IF receiver differs from a conventional DCR receiver in that the low pass filters of a conventional DCR receiver, as shown in FIG. 3, have been replaced by bandpass filters 614, 616, to filter the I and Q signals respectively. The band pass characteristics of the band pass filters have been shown on FIG. 5, as the dashed lines 324, 322, around the wanted component signal bands 308, 310. It can be seen that the downconverted components 320 of the higher power radio frequency signal are rejected by the band pass filters in the I and Q signal paths, so that saturation of the A/D converter by the unfiltered downconverted components 320 of the higher power radio frequency signal may be avoided.

Figure 7:
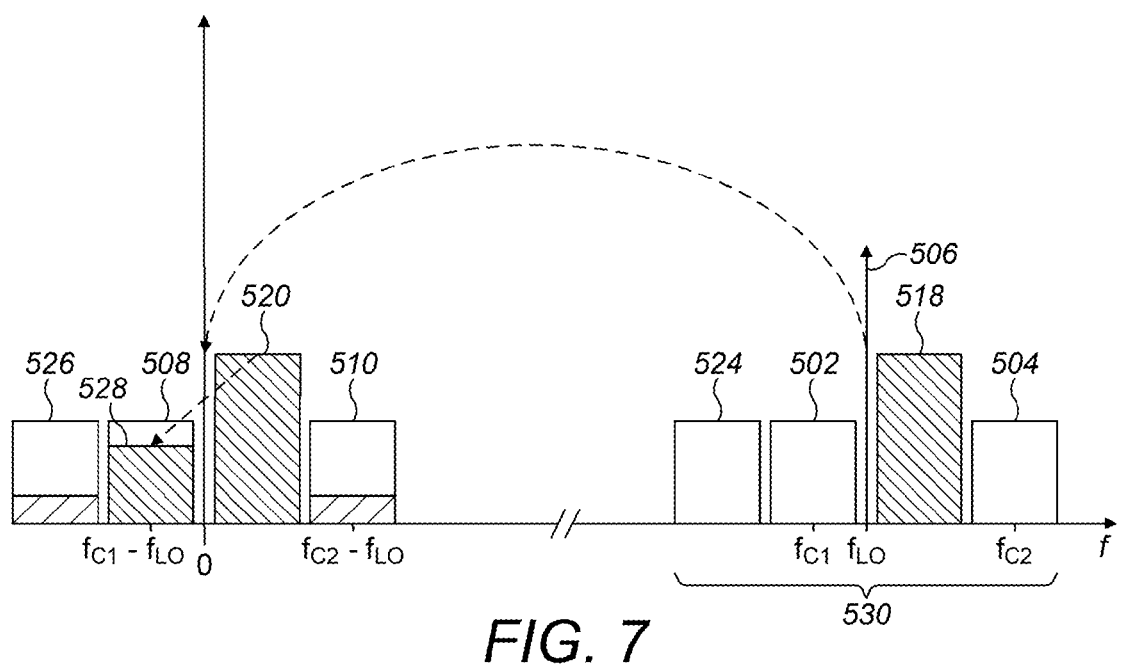
FIG. 7 is a diagram illustrating problems with reception of non-contiguous aggregated carriers in a direct conversion receiver.

FIG. 7 is a diagram illustrating problems with reception of non-contiguous aggregated carriers in a direct conversion receiver. This illustrates the situation shown in FIG. 2, in which component signals bands 524, 502, 504 in a non-contiguous carrier aggregation system are arranged in two groups, or clusters, the first group occupying a wider frequency region than the second group. A higher power signal 518 is located in a frequency region between the first group and the second group. In this case, by contrast to the situation shown in FIG. 5, it can be seen that the images 528 of the higher power radio frequency, signal that result from the finite image reject ratio fall directly in the same band as one of the downconverted component signal bands 508. Depending on the difference between the received power of the higher power signal, the received power of the wanted received signals, and the image reject ratio, this situation may prevent reliable transmission of the signals in band 508.

Figure 8:
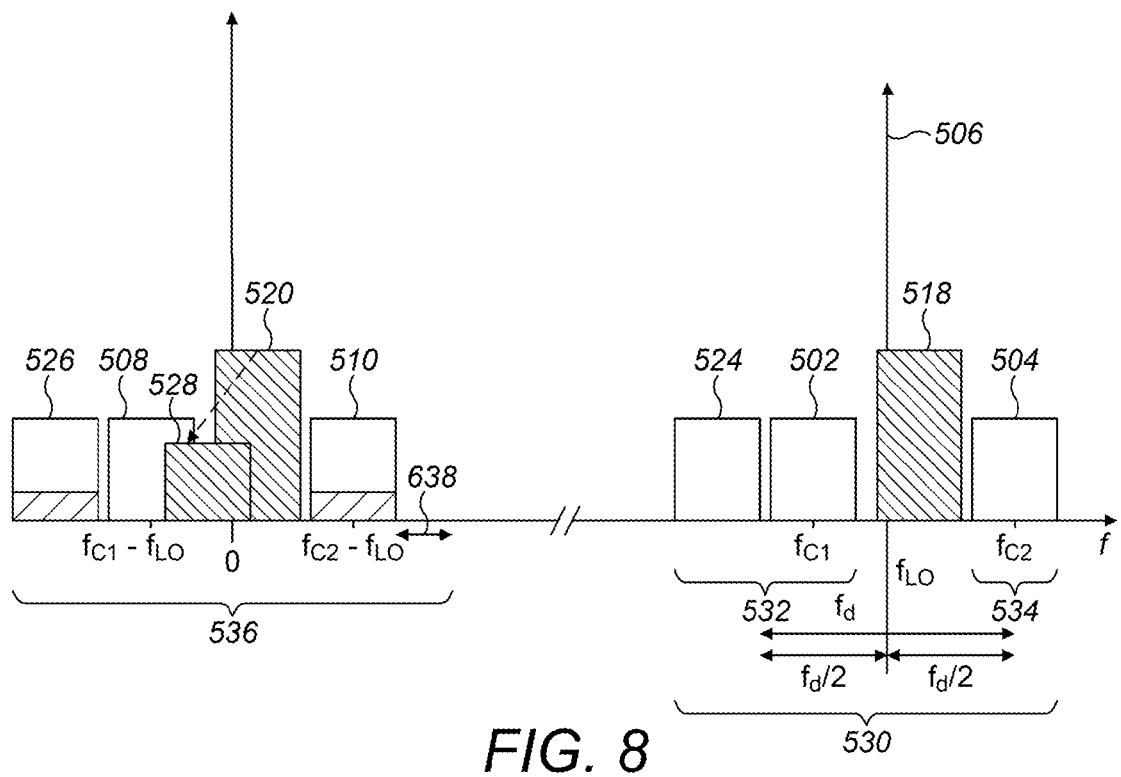
FIG. 8 is an amplitude-frequency diagram illustrating reception of non-contiguous aggregated carriers in a direct conversion receiver in an embodiment of the invention.

FIG. 8 shows a solution to the problems illustrated by FIG. 7 in an embodiment of the invention. As can be seen, the local oscillator is offset from the centre of the band encompassing the wanted signals, that is to say offset from the centre of the band 530 defined by a combination of the frequency regions occupied by the two groups of signals and the frequency region in between, i.e. offset from the centre of a band defined by outer edges of the frequency regions occupied by the two groups.

When the LO frequency is set as shown in FIG. 8, it can be seen that the images 528 of the higher power radio frequency signal that result from the finite image reject ratio is only partly overlapping the downconverted component signal band 508. As can be seen, part of the bands are affected by the image while other parts are not. Due to interleaving of sub-carriers and the use of error correction coding, a typical modulation format, such as Orthogonal Frequency Division Multiplexing (OFDM), may be tolerant to the degradation of a proportion of the band, whereas it would not be tolerant if the degradation were applied to the whole band. Therefore, the situation in FIG. 8 may allow acceptable reception of component signal band 508, whereas the situation in FIG. 7 may not. As can be seen from FIG. 8, preferably the LO is set such that the distance from the LO to the centre of each of the two wanted clusters 532, 534 is equal. Setting the local oscillator in this way has the advantage of minimising interference due to finite image rejection ratio resulting from both an unwanted signal between the wanted signal clusters, and also minimising interference from unwanted signals adjacent to the wanted signal clusters situated away from the local oscillator frequency. In an embodiment of the invention, the offset of the local oscillator frequency may be determined in dependence on a measurement of signal quality, such as signal to noise plus interference ratio, of at least one of the plurality of radio frequency signals. For example, if an unwanted signal adjacent to the wanted signal clusters situated away from the local oscillator frequency on the high frequency side is greater than another unwanted signal adjacent to the wanted signal clusters situated away from the local oscillator frequency on the low frequency side, it may be determined that the local oscillator offset should be set at a position that causes the least total interference with the wanted signals. This may be determined on the basis of signal to noise plus interference ratio measurements for each of the wanted signals.

Figure 9:
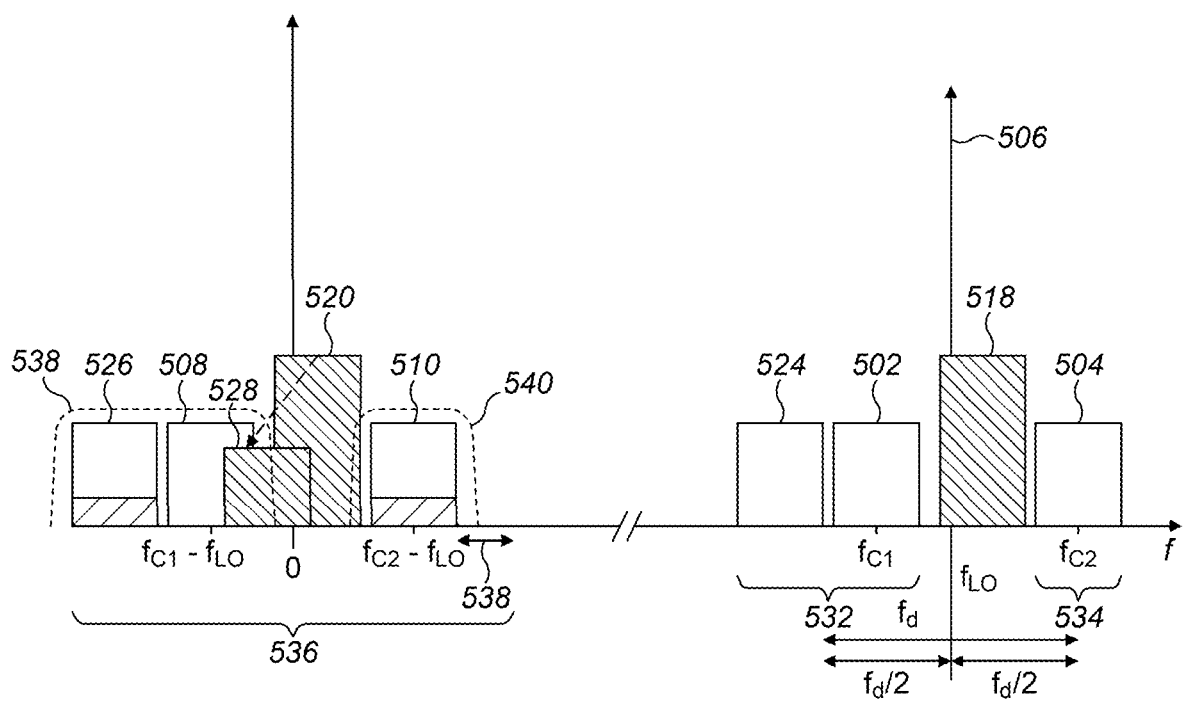
FIG. 9 is an amplitude-frequency diagram illustrating reception of non-contiguous aggregated carriers in an receiver having different passband filters for the high side and low side signals in an embodiment of the invention.

FIG. 9 shows that that setting of the local oscillator may be used in conjunction with a receiver having two bandpass filter characteristics 540, 538 one of which 538 is wider than the other 540. The bandpass characteristics may be set to be appropriate to receive the component signal bands in the respective groups of signals.

Figure 10:
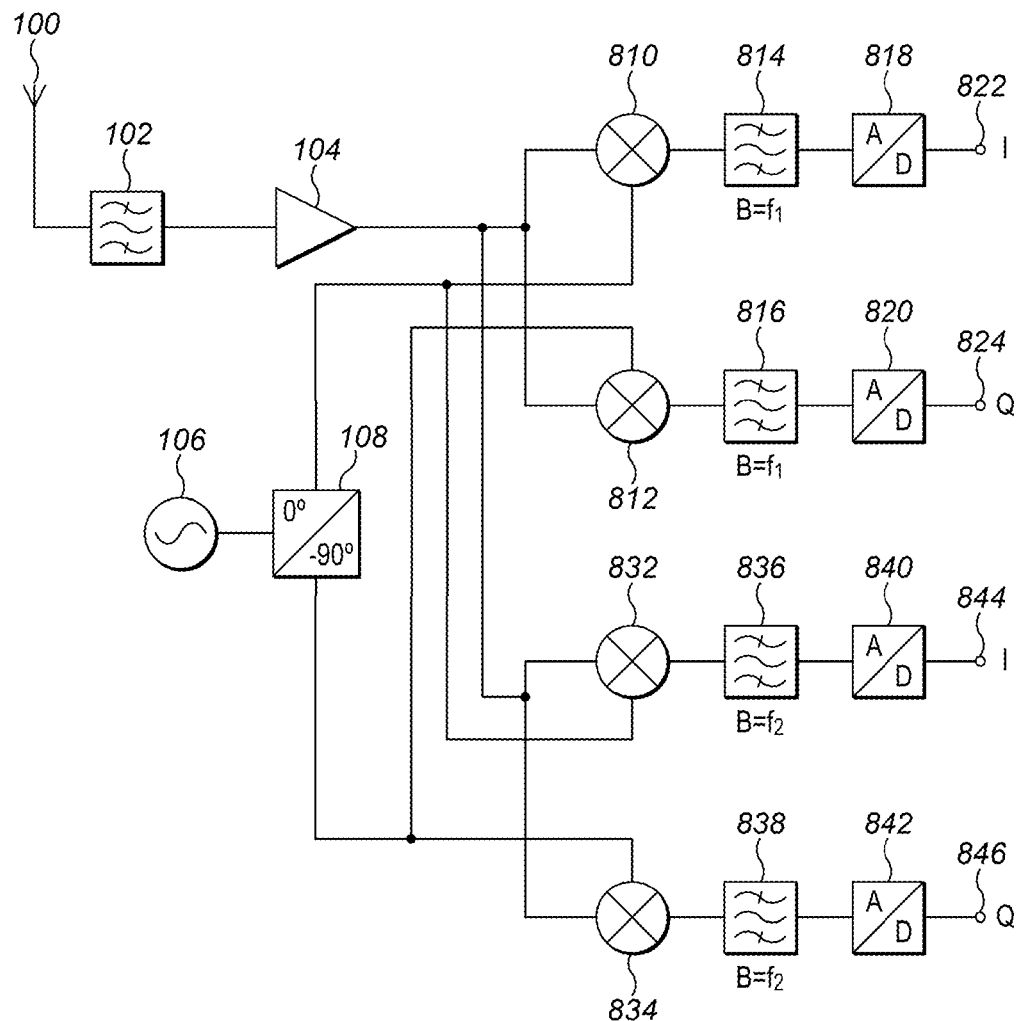
FIG. 10 is a schematic diagram showing a receiver having two zero IF branches each having different bandpass filters in an embodiment of the invention.

FIG. 10 is a schematic diagram showing a receiver having two bandpass filter characteristics as illustrated in FIG. 9 in an embodiment of the invention. The receiver has two branches. A first branch is a low IF receiver having I and Q channels, each of which has a bandpass filters 814, 816 with a first bandwidth. A second branch is also configured as a low IF receiver as shown in FIG. 10, and also has I and Q channels, each of which has a bandpass filters 836, 838 with a second bandwidth, different from the first bandwidth. A first subset of downconverted radio signals may be received using the first branch, and a second subset of downconverted radio signals may be received using the second branch.

Figure 11:
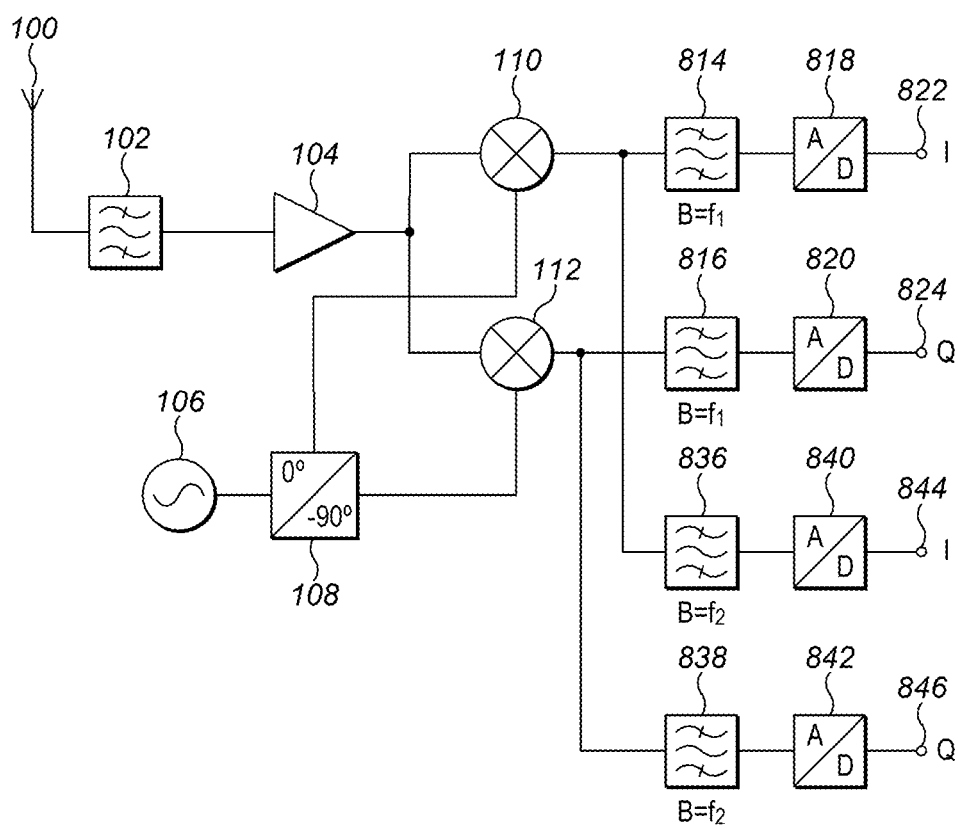
FIG. 11 is a schematic diagram showing an alternative receiver having two zero IF branches each having different bandpass filters in an embodiment of the invention.

FIG. 11 is a schematic diagram showing an alternative receiver having two branches each having different bandpass filters in an embodiment of the invention, in which a single set of quadrature mixers is shared between the two branches.

Embodiments of the invention will now be described in more detail. Embodiments of the invention relate to multi-carrier wireless systems, using carrier aggregation. Operators may own non-contiguous allocation of spectrum; this may come about, for example, if an operator buys another operator's businesses. If the spectrums happen to be non-adjacent then the allocation is non-contiguous. Operators typically wish to exploit their spectrum as effectively as possible, so the need for non-contiguous multi-carrier systems is increasing. An example of such scenario is presented in FIG. 2. In a scenario such as that illustrated in FIG. 2, there may be a problem with single receiver chain architecture in that it may not be known or guaranteed a priori what is allocated in the gap between the two non-contiguous carriers. Typically, another operator's licensed spectrum may be present in the gap. Furthermore, it cannot be guaranteed that the other operator's signal, that is to say deployed spectrum, is not significantly stronger than the wanted signal at the receiver input. This may place large demands on the receiver performance in terms of dynamic range and image rejection performance.

Table 1 below gives example of possible allocations of blocks of carriers within a single band. In table 1, in the column headed "configuration", "C" represents a 5 MHz component carrier and the gap length is expressed as a number in MHz.

TABLE 1

Summary of operators' scenarios.

| Scenario | Band | Gap length | Number of Component Carriers | Configuration |
|---|---|---|---|---|
| A | I | 5 | 2 | C-5-C |
| B | I | 5 | 3 | C-5-CC |
| C | I | 10 | 4 | C-10-CCC |
| D | IV | 5 | 2 | C-5-C |
| E | IV | 10 | 3 | C-10-CC |
| F | IV | 15 | 4 | CC-15-CC |
| G | IV | 20 | 3 | CC-20-C |
| H | IV | 25 | 4 | CC-25-CC |

The reception of two or more non-contiguous component carriers causes several design challenges for a receiver containing one reception branch only. The simplified block diagram of a typical direct-conversion receiver (DCR) is presented in FIG. 12. The signal is amplified in the low-noise amplifier (LNA) before being down-converted to zero intermediate frequency (IF). For phase- and frequency-modulated signals, the down-conversion must be performed with quadrature local oscillator (ID) signal to prevent signal sidebands from aliasing on one another. Prior to analogue-to-digital conversion (ADC or A/D), the signal is low-pass filtered and amplified such that the signal for the ADC is at sufficient level. A DCR is typically used in cellular user equipments (UEs) in, for example, GSM, WCDMA, HSPA, and single-carrier LTE modes, for example in Release 7, 8 or 9 LTE. From the point of view of integrated circuit development, DCR has several advantages compared to other receiver types, such as low complexity and power consumption, small silicon area, and a low number of off-chip components.

Figure 12:
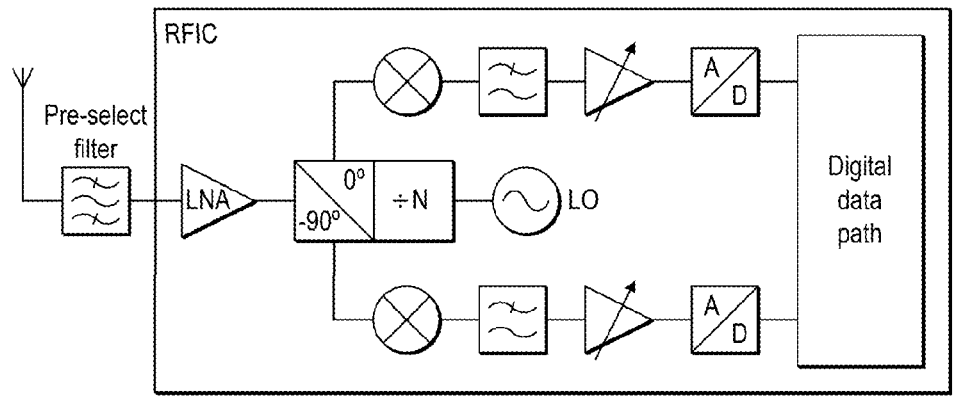
FIG. 12 is a diagram illustrating a conventional direct conversion receiver as implemented in an RFIC.

For a single receiver UE including conventional DRC hardware as shown in FIG. 12, the scenario shown in FIG. 2 is challenging. Firstly, since deployed spectrum of operator B shown is located in the wanted channel, it passes through the analogue circuitry without any filtering. Thus, the dynamic range of the analogue-to-digital converter (ADC) needs to be increased by the amount of power difference between the unwanted and wanted carriers. In addition to the increased bandwidth required to receive non-contiguous aggregated carriers, the dynamic range requirement makes ADC design even more challenging and power consuming.

Secondly, the gain control of the receiver becomes more challenging, since the maximum gain setup in different RF front-end blocks (LNA, Mixer, filters) is dominated by the strong unwanted carrier to prevent the receiver from saturation and/or clipping. As a result, the gain may be set to a lower value than would be ideally required for the weaker carriers, thus deteriorating the signal-to-noise performance of the weaker carriers.

Thirdly, in practice, due to imperfections such as component mismatch in down-conversion mixers and analogue baseband filters and the quality of quadrature signals from the local oscillator, there is a finite amplitude and phase balance between the in-phase (I) and quadrature phase (Q) branches. That is to say, there are errors in matching between the phase and amplitude of the inphase and quadrature signals paths. As has been already mentioned, this leads to a finite image reject ratio (IRR).

Figure 13:
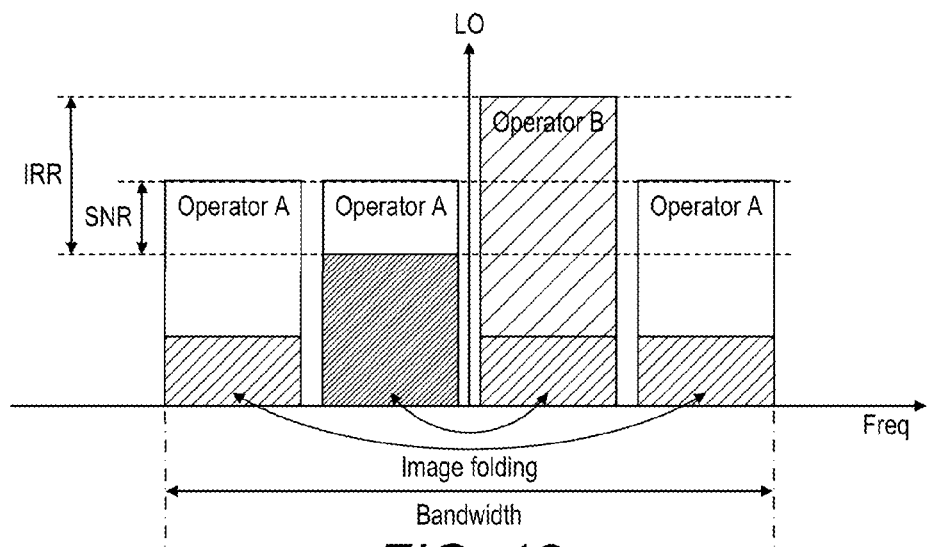
FIG. 13 is a frequency-amplitude diagram illustrating problems with reception of non-contiguous aggregated carriers in a direct conversion receiver, showing image frequencies at the equivalent position in RF frequency.
Figure 14:
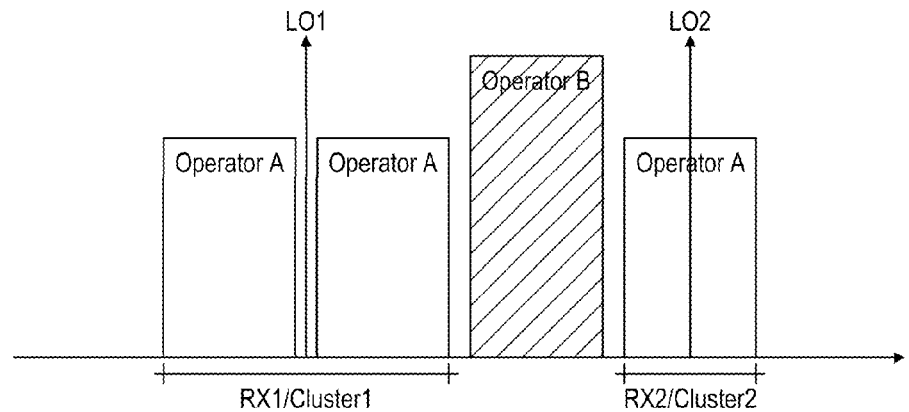
FIG. 14 is a frequency-amplitude diagram illustrating a conventional solution for the reception of non-contiguous aggregated carriers, by the use of two receivers, each having a different local oscillator frequency.

FIG. 13 depicts a case, such as, for example, may result from 4 carrier High Speed Downlink Packet Access (4C-HSDPA) with strong unwanted carrier received and down converted with a demodulator having a finite 10 performance. Due to the finite image-reject ratio (IRR), the more powerful unwanted carrier will generate a strong image signal overlapping the weaker carrier locating at opposite side of the LO. This may not achieve sufficient signal-to-noise ratio (SNR) to receive the weaker carrier.

So, as has been mentioned, the reception of non-contiguous CA signals in a conventional DR receiver presents challenges regarding the ADC design (dynamic range vs. power consumption), RF/analogue gain control, and RE images. These challenges apply to both the reception of non-contiguous (NC) carrier aggregation in HSDPA and LTE, and to the use of non-contiguous carrier aggregation for future standards to achieve high peak data rates. Furthermore, high SNR figures are needed to be able to operate with 64QAM modulation to reach the highest data rates. As a result, a small impairment in signal quality or dynamic range caused by the presence of the operator B signal can have a significant effect.

It is preferable that a single direct-conversion receiver is utilised in user equipment intended to receive NC-HSDPA (or non-contiguous LTE), as the user equipment may also be configured for lower data rates and single carrier operation, and user expectations would be for similar or better battery life than legacy UEs when operating at lower data rates (i.e. in non-carrier aggregation mode). However, as already mentioned, a UE with a conventional single receiver path is unlikely to be able to receive intra-band non-contiguous carriers with maximal SNR.

Figure 15:
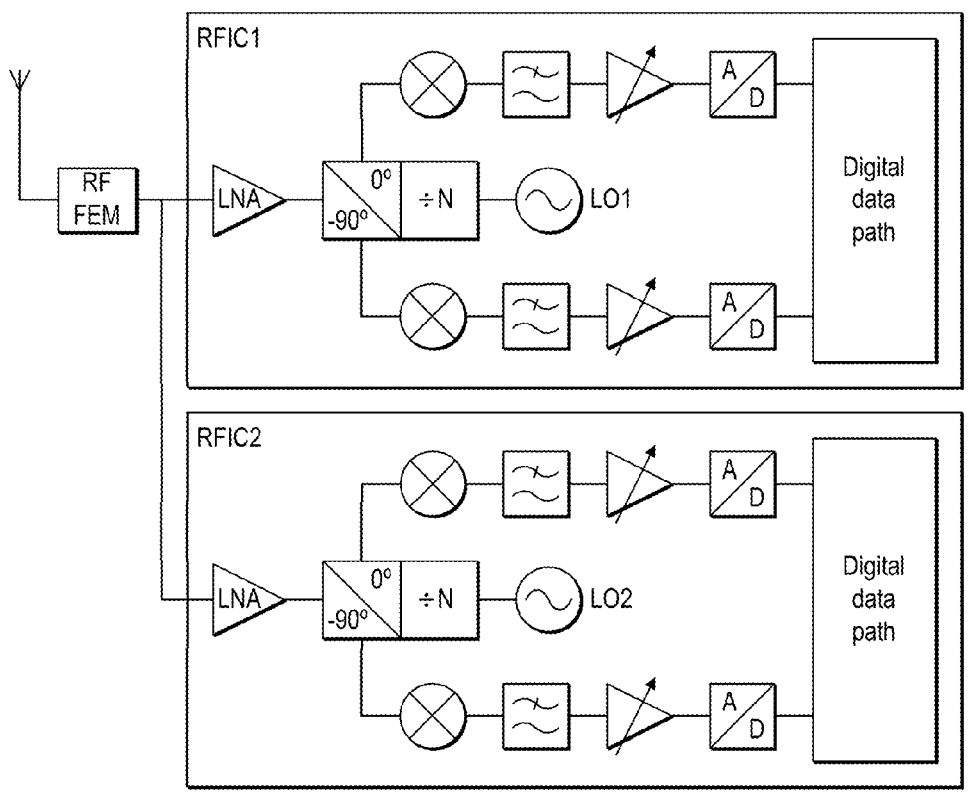
FIG. 15 is a schematic diagram illustrating an RF IC implementation for the reception of non-contiguous aggregated carriers, by the use of two receivers, each having a separate RFIC and a different local oscillator frequency.
Figure 16:
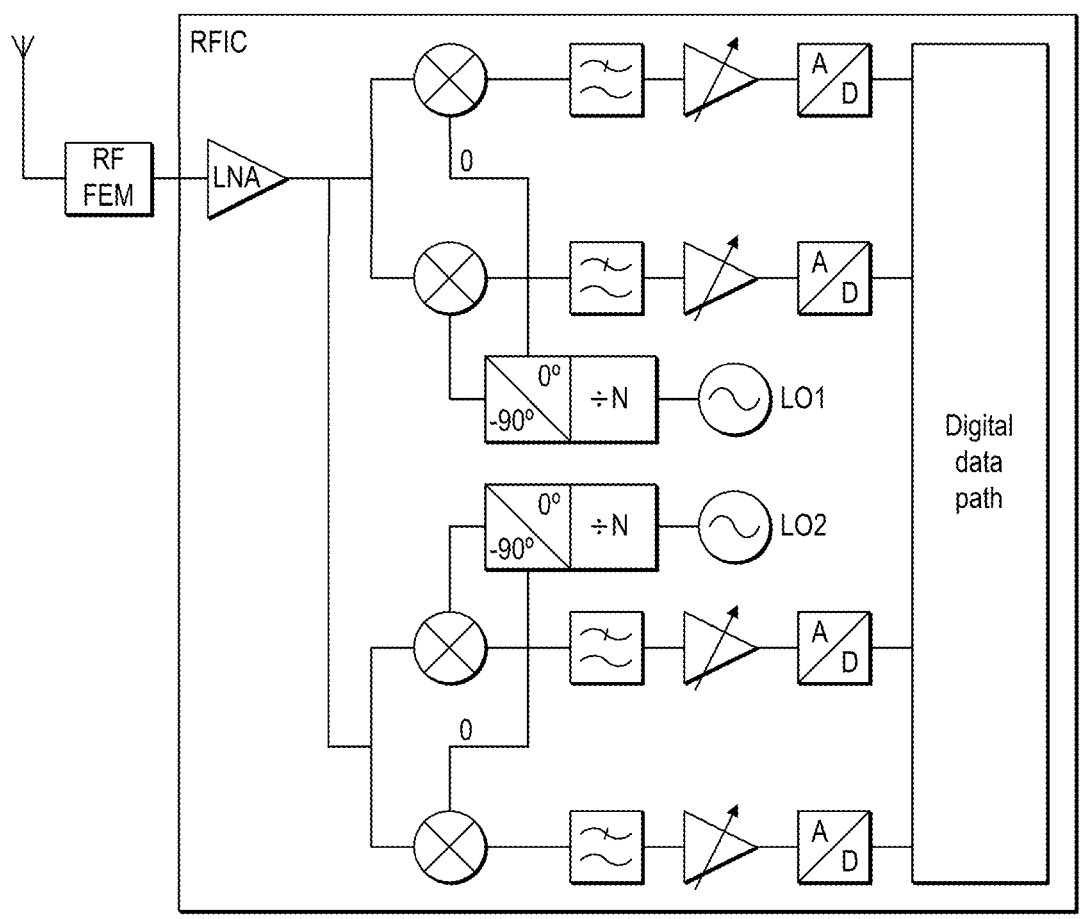
FIG. 16 is a schematic diagram illustrating an RF IC implementation for the reception of non-contiguous aggregated carriers, by the use of two receivers, each having a different local oscillator frequency on a single RFIC.

One potential method of receiving non-contiguous carrier aggregation signals is to receive separate clusters of component carriers in separate receiver chains, each having a LO signal of its own. This is depicted in FIG. 15, where Cluster1 and Cluster2 are each handled by a separate respective receiver chain, as shown in FIG. 15. However, the solution illustrated by FIG. 15 may increase the complexity of the Front End Module (FEM), due to the need for signal splitting and the need to minimise local oscillator coupling between channels, which in turn may lead to a higher cost and increased insertion loss. In addition, in the solution presented in FIG. 16, having two LO synthesizers operating at frequencies close each other might suffer from LO pulling, which can lead to increased phase noise, instability and presence of sideband tones. Within a single die it is challenging to achieve sufficient isolation between two LOs having a small frequency separation between each other. Possibly, two simultaneously running synthesisers could operate at two completely different RF frequencies but the final LO frequency could be generated with different frequency division ratios (e.g. 4 GHz divided by 2 and 6 GHz divided by 3). That solution, however, may lead to complicated design (either fractional or odd frequency division ratios could be needed) and would possibly generate unwanted tones.

In an embodiment of the invention, a DCR is configured such that it is able to handle two non-contiguous clusters with improved SNR with a single Radio Frequency Integrated Circuit (RFIC). In an embodiment of the invention, two clusters are each received with a different bandwidth filter.

Figure 17:
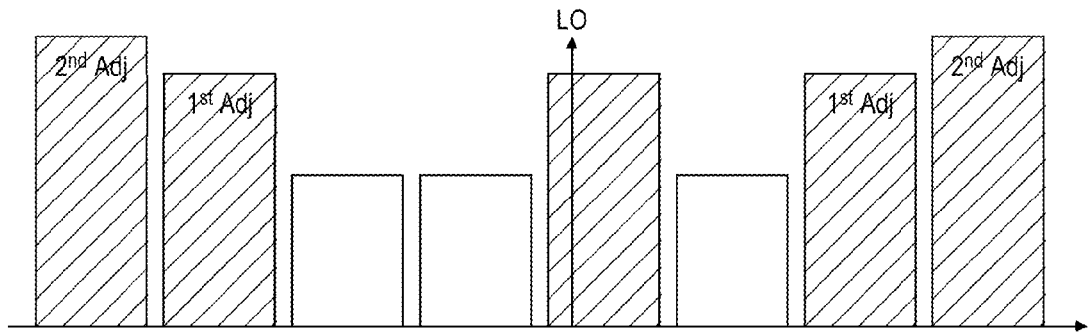
FIG. 17 is an amplitude-frequency diagram illustrating reception of non-contiguous aggregated carriers, with a single signal from another operator between the wanted carrier signals in an embodiment of the invention.
Figure 18:
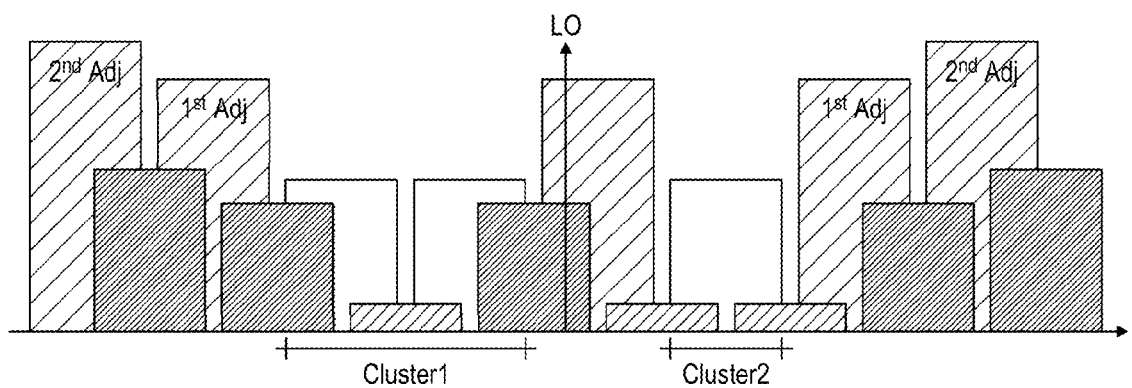
FIG. 18 is an amplitude-frequency diagram illustrating the reception of non-contiguous aggregated carriers, showing a single signal from another operator between carrier aggregation clusters and the effect of image frequencies in an embodiment of the invention.

FIG. 17 presents a scenario similar to one shown in FIG. 13, except the first and second adjacent channels are now presented. In an embodiment of the invention, the LO signal is placed offset from the centre of the illustrated band to be received, as shown in FIG. 17. This has the advantage that the effect of resulting images signals is minimized, as illustrated in FIG. 18. After the LO frequency is placed as shown in FIG. 18, the images of the unwanted adjacent channels are only partly overlapping with wanted channels in Cluster1 as shown. The average SNR impairment across a band due to image signal folding, that is to say due to finite image reject ratio, is thus reduced in the worst affected bands at the expense of degrading the SNR impairment in bands that were not affected with a conventional placing of the local oscillator. As can be seen, part of the bands are affected by signal folding while other parts are not. As has already been mentioned, due to interleaving of subcarriers and the use of error correction coding, a typical modulation format, such as OFDM, may be tolerant to the degradation of a proportion of the band, whereas it would not be tolerant if the degradation were applied to the whole band.

Figure 19:
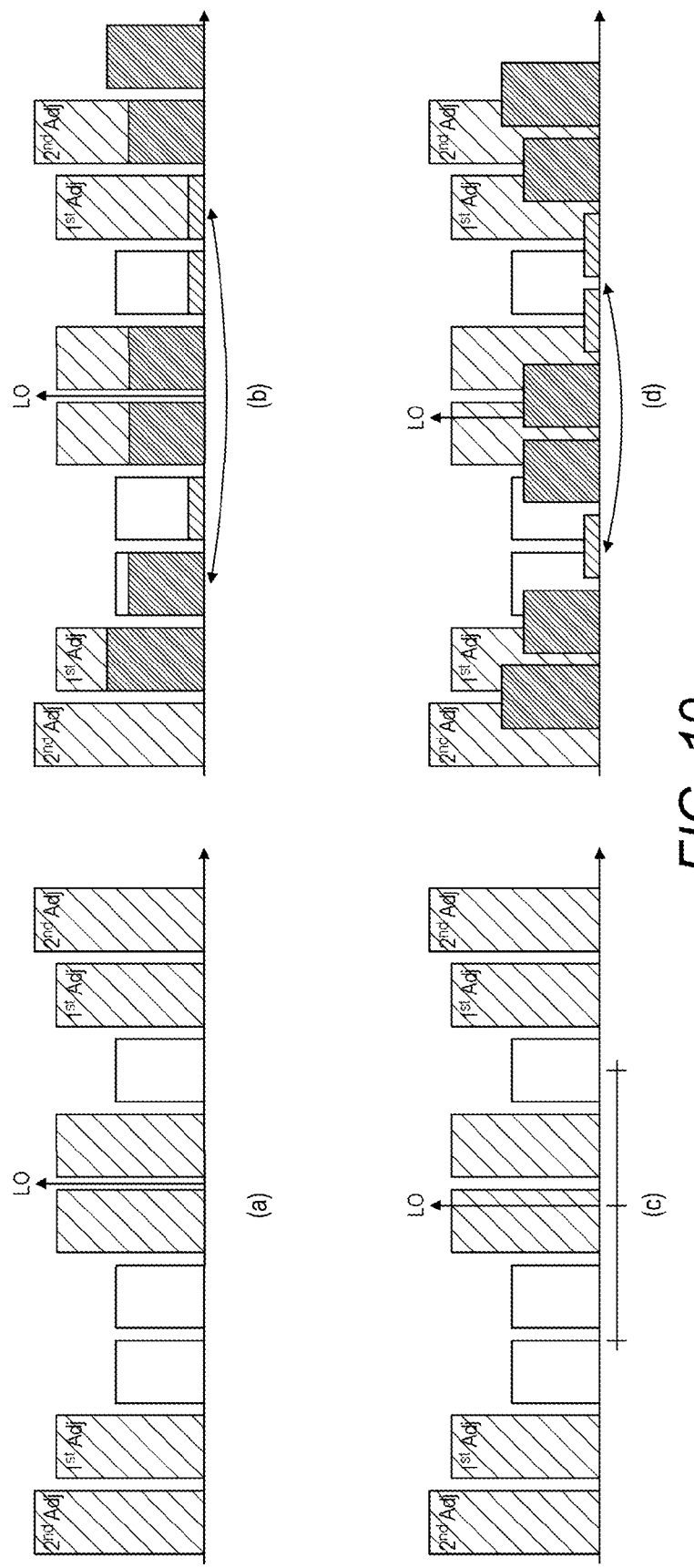
FIG. 19 is an amplitude-frequency diagram illustrating the reception of non-contiguous aggregated carriers, showing two signals from another operator between carrier aggregation clusters and the effect of image frequencies in an embodiment of the invention.

An additional example is presented in FIG. 19. The scenario is similar to the previous one but now there are two carriers deployed by the other operator in the centre of the band, as shown in FIG. 19(a). A conventional approach to the reception of the signals shown in FIG. 19(a) is shown in FIG. 19(b), in which the LO is placed between the two unwanted carriers, but as a result, one of the wanted carriers suffers from image signal due to the first adjacent high side channel. In an embodiment of the invention, this is mitigated by placing the LO such that the distance from the LO to the centre of each of the two wanted clusters is equal, as shown in FIG. 19(c). As a result, after down-conversion the image of the wanted carrier in the narrow cluster is located between the two wanted carriers, as shown in FIG. 19(d). Now, image signals due to adjacent channels overlap the wanted carriers only partly and SNR degradation is averaged over the channel. As already mentioned, a typical modulation and coding format may be tolerant of a reduced SNR over a part of the band.

Figure 20:
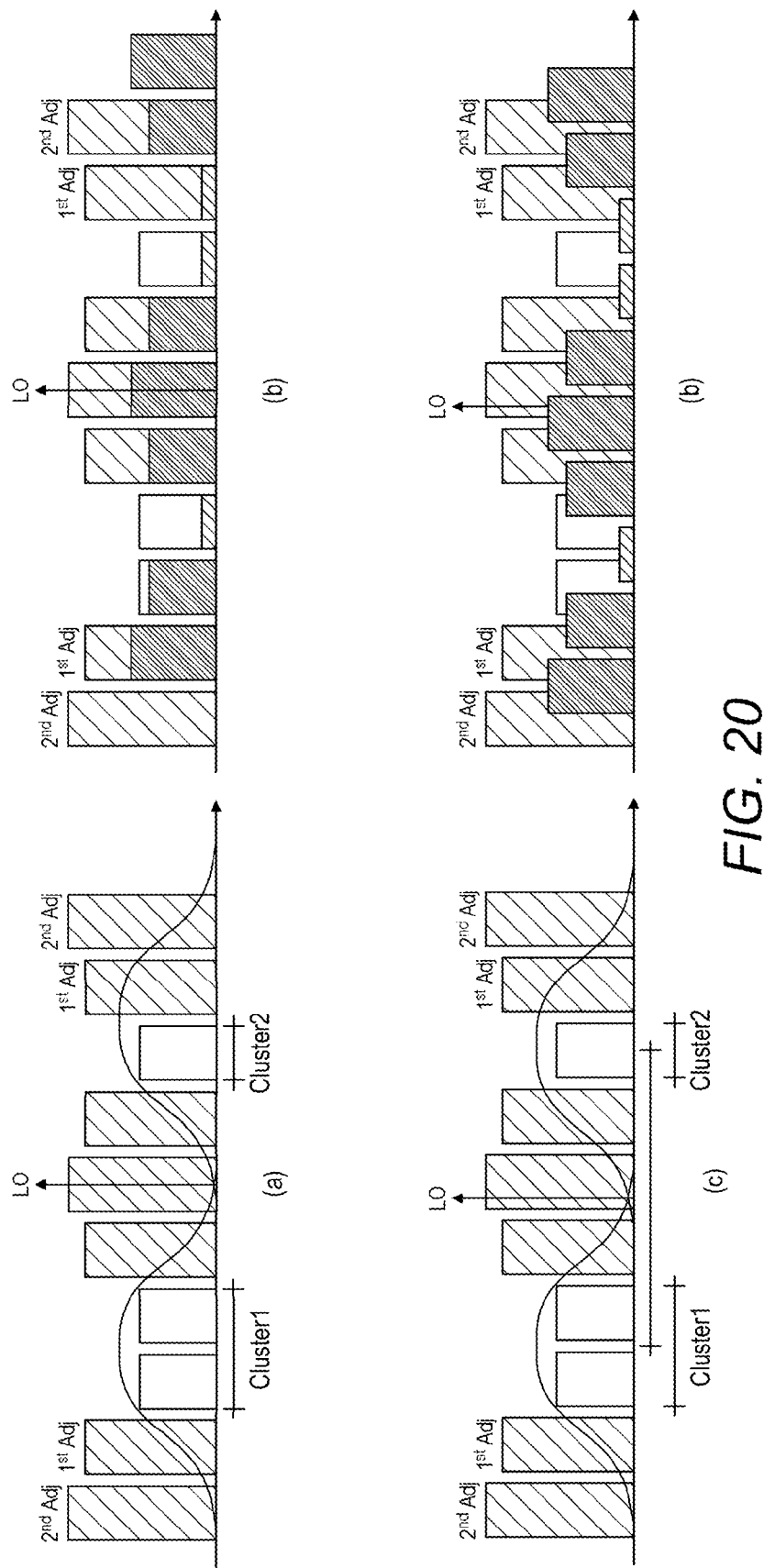
FIG. 20 is an amplitude-frequency diagram illustrating the reception of non-contiguous aggregated carriers, showing three signals from another operator between carrier aggregation clusters and the effect of image frequencies in an embodiment of the invention.

FIG. 20 gives an example of a scenario in which there are three unwanted carriers between the wanted clusters. As shown in FIGS. 20(a) and 20(b), a conventional LO location may be at the centre of the most powerful carrier. Then, the image due this most powerful carrier would be placed on top of the most powerful carrier itself, as shown in FIG. 20(b). However, the SNR degradation due to image folding is minimized in an embodiment of the invention, when the LO is placed substantially half way between the centres of the clusters, as shown in FIG. 10(c), or at least within approximately an eighth of a carrier bandwidth of this position.

In an embodiment of the invention, the improved positioning of the LO may be used advantageously in combination with a low IF receiver. A low IF receiver may be realised as illustrated in FIG. 6 by the substitution of a band pass filter for the low pass filter of a conventional direct conversion receiver.

FIGS. 20(a) and 20(c) show the passband filter characteristic of a low IF receiver, shown referred to RF frequencies. As may be seen from a comparison of FIG. 20(a) with FIG. 20(c), the passband filter in the case illustrated by FIG. 20(c) attenuates adjacent channels of Cluster2 more efficiently than that in the case illustrated by FIG. 20(a).

Figure 21:
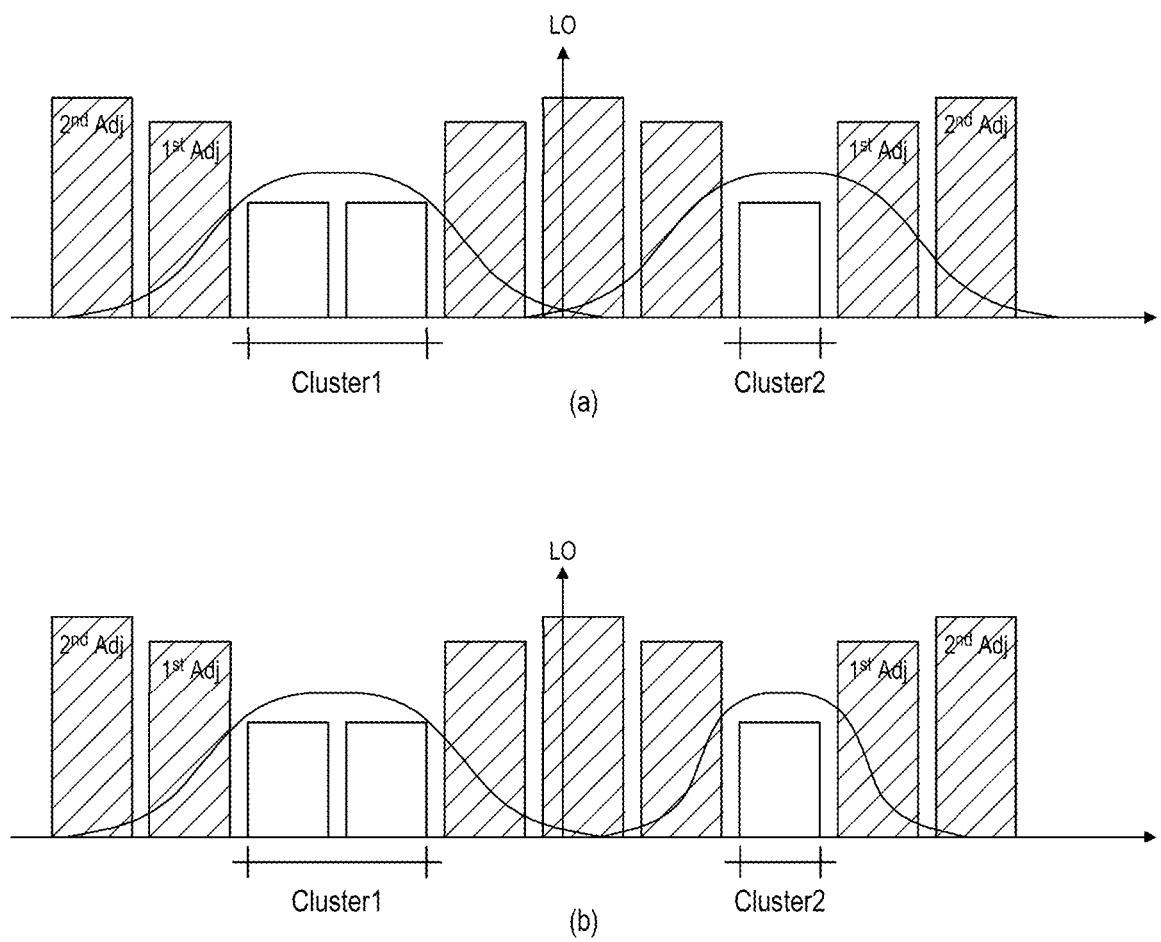
FIG. 21 is an amplitude-frequency diagram illustrating the reception of non-contiguous aggregated carriers, showing a different filter bandwidth used for the reception of high side and low side signals in an embodiment of the invention.

In an embodiment of the invention, the improved positioning of the LO may be used advantageously in combination with a low IF receiver, having two receiver branches, one receiver branch having a different bandpass filter characteristic from the other. Such a two branch low IF receiver is shown in FIG. 10, and an alternative implementation is shown in FIG. 11. As shown in FIG. 21(b), the use of a narrower bandpass filter to filter the narrower cluster, Cluster2, improves the rejection of adjacent channels, as compared to the case with a the use of the same filter bandit to receive high and low side signals, as in the case shown in FIG. 21(a). FIG. 21 (a) may represent the case, for example, in which a single branch low IF receiver used.

The use of analogue bandpass filters may reduce the dynamic range required by the A/D converter, since interfering signals may be removed before conversion.

Figure 22:
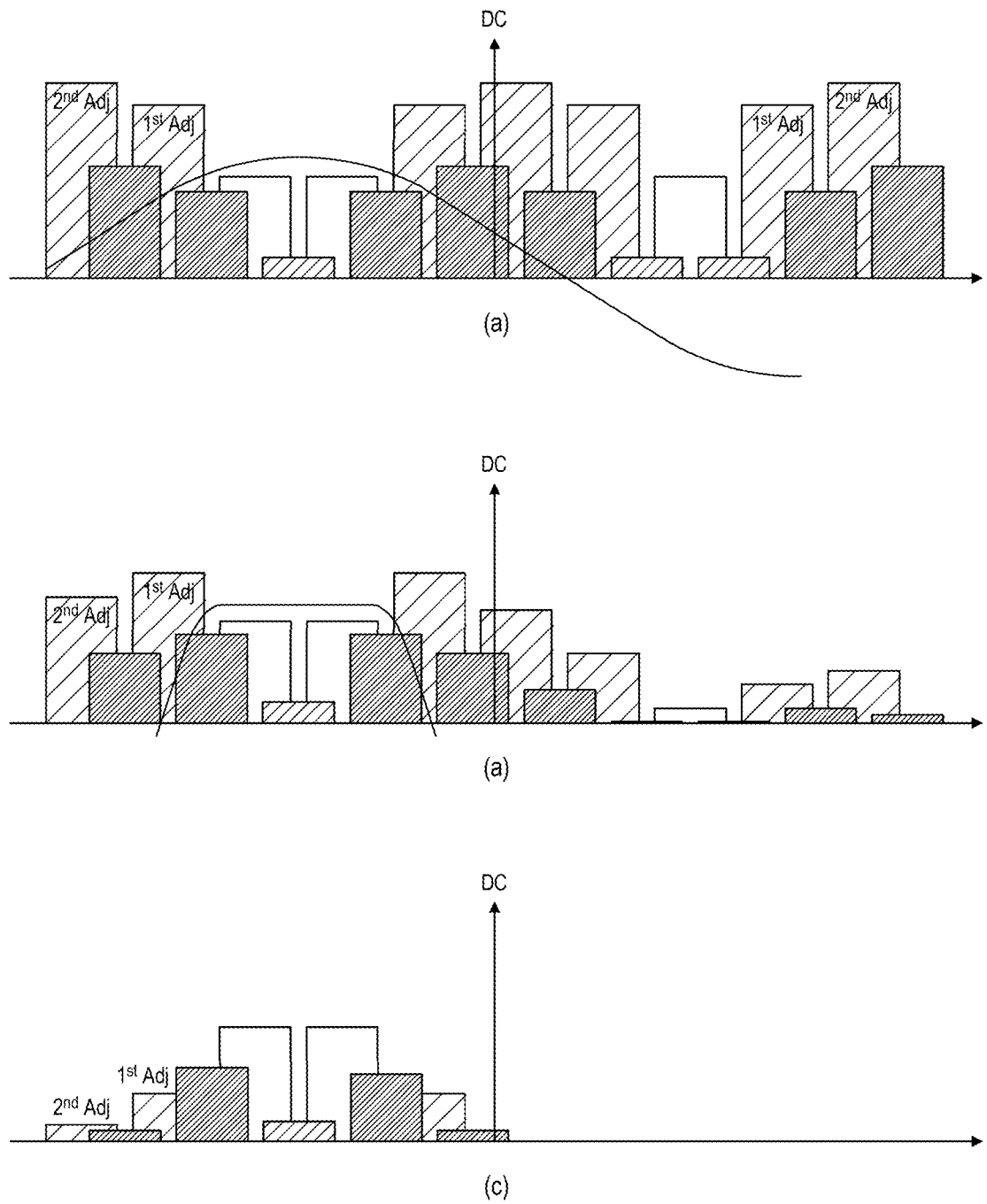
FIG. 22 is an amplitude-frequency diagram illustrating the reception of non-contiguous aggregated carriers, showing a) the use of a complex filter characteristic b) the effect of the complex filter characteristic shown with a digital filter characteristic superimposed and c) the combined effect of the complex and digital filters.
Figure 23:
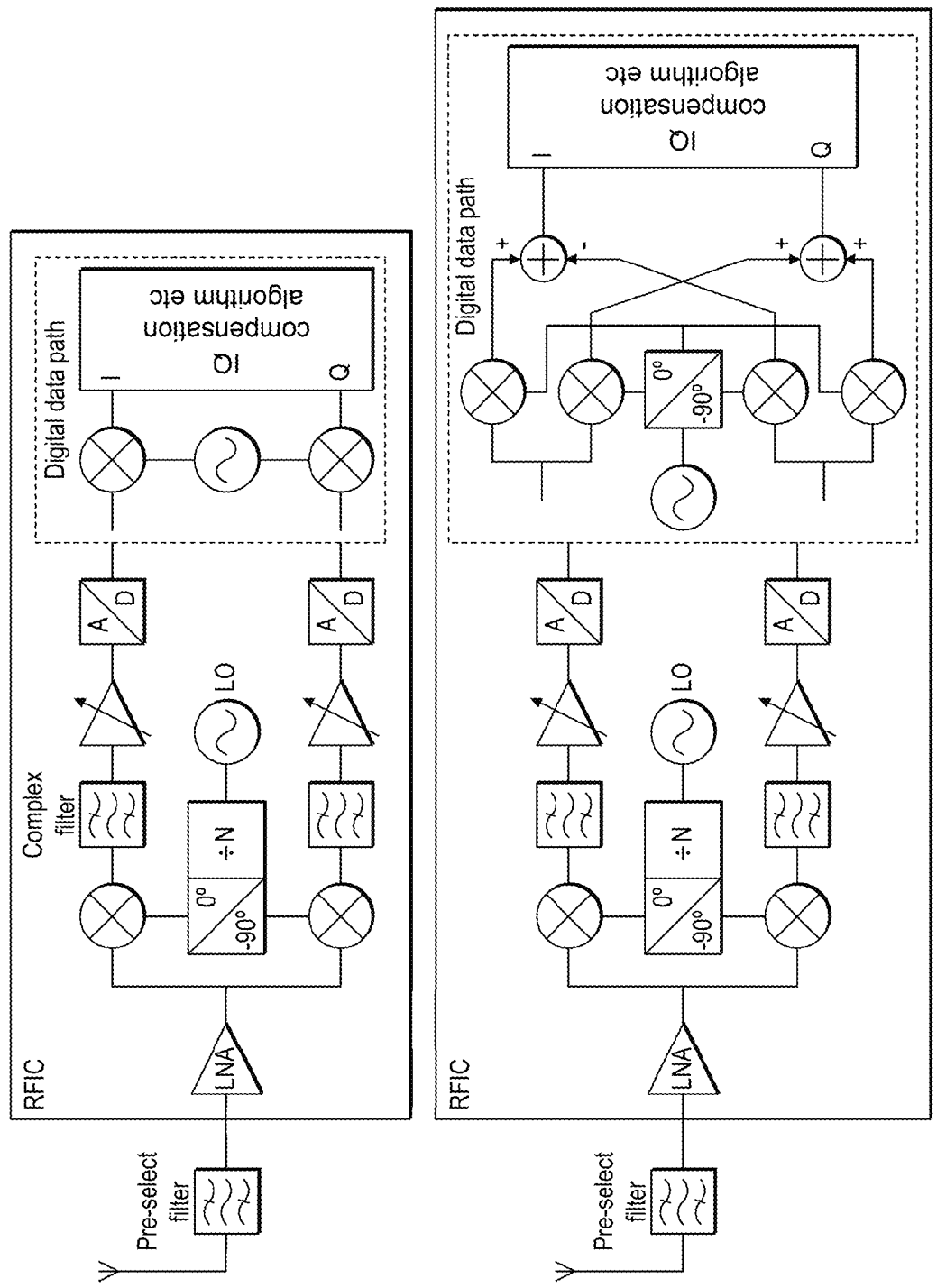
FIG. 23 (upper part) is schematic diagram showing a receiver architecture having complex filters and a digital data path.

In an embodiment of the invention, the analogue, typically bandpass filters, are implemented using a complex filtering method, that is to say each filter may process components of both the I and Q channels. Then, the filter response is asymmetric in respect to zero frequency as shown in FIG. 22(a). In this case, the image signal located at the opposite side of the zero frequency can be filtered out. As a result, carrier separation in the digital domain could be implemented with typical digital down-conversion mixers as shown in the upper part of FIG. 23. Alternatively, if conventional real-only analogue filters are used, the digital down-conversion could include a complex scheme to attenuate the image signal, as shown in the lower part of FIG. 23.

Although at least some aspects of the embodiments described herein with reference to the drawings include computer processes performed in processing systems or processors, the invention also extends to computer programs, particularly computer programs on or in a carrier, adapted for putting the invention into practice. The program may be in the form of non-transitory source code, object code, a code intermediate source and object code such as in partially compiled form, or in any other non-transitory form suitable for use in the implementation of processes according to the invention. The carrier may be any entity or device capable of carrying the program. For example, the carrier may include a storage medium, such as a solid-state drive (SSD) or other semiconductor-based RAM; a ROM, for example a CD ROM or a semiconductor ROM; a magnetic recording medium, for example a floppy disk or hard disk; optical memory devices in general; etc.

It will be understood that the processor or processing system or circuitry referred to herein may in practice be provided by a single chip or integrated circuit or plural chips or integrated circuits, optionally provided as a chipset, an application-specific integrated circuit (ASIC), field-programmable gate array (FPGA), etc. The chip or chips may include circuitry (as well as possibly firmware) for embodying at least one or more of a data processor or processors, a digital signal processor or processors, baseband circuitry and radio frequency circuitry, which are configurable so as to operate in accordance with the exemplary embodiments. In this regard, the exemplary embodiments may be implemented at least in part by computer software stored in (non-transitory) memory and executable by the processor, or by hardware, or by a combination of tangibly stored software and hardware (and tangibly stored firmware).

The above embodiments are to be understood as illustrative examples of the invention. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A method of receiving data transmitted via a combination of a plurality of radio frequency signals using carrier aggregation, the method comprising:
processing at least said plurality of radio frequency signals using a local oscillator, each radio frequency signal occupying a respective band of a plurality of radio frequency bands, the plurality of radio frequency bands being arranged in two groups, a first group and a second group, separated in frequency by a first frequency region, each of the groups including one or more radio frequency bands and the first group occupying a wider frequency region than the second group; and
setting said local oscillator, during said processing, to a frequency that is offset from the centre of a band defined by outer edges of the frequency regions occupied by the two groups,
wherein the frequency to which the local oscillator is set is within one quarter of the bandwidth of one of the plurality of radio frequency bands from a frequency mid-way between the centre of the frequency region occupied by the first group and the centre of the frequency region occupied by the second group.

2. The method according to claim 1, wherein the frequency to which the local oscillator is set is within one eighth of the bandwidth of one of the plurality of radio frequency bands from a frequency mid-way between the centre of the frequency region occupied by the first group and the centre of the frequency region occupied by the second group.

3. The method according to claim 1, wherein the first frequency region is not used for transmitting said data.

4. The method according to claim 1, wherein the first frequency region comprises a radio frequency band occupied by a radio frequency signal that is not aggregated with said plurality of radio frequency signals.

5. The method according to claim 1, wherein at least one of the groups includes non-contiguous radio frequency bands.

6. The method according to claim 1, wherein the frequency to which the local oscillator is set is substantially mid-way between the centre of the frequency region occupied by the first group and the centre of the frequency region occupied by the second group.

7. The method according to claim 1, the method further comprising:
determining the offset in dependence on a measurement of signal quality of at least one of the plurality of radio frequency signals.

8. The method according to claim 7, further comprising:
receiving a first subset of the downconverted plurality of radio frequency signals using the first bandpass filtered inphase and quadrature components and
receiving a second subset of the downconverted plurality of radio frequency signals using the second bandpass filtered inphase and quadrature components, wherein:
the first subset of the downconverted plurality radio frequency signals are downconverted from radio frequency bands in the first group; and
the second subset of the downconverted plurality radio frequency signals are downconverted from radio frequency bands in the second group.

9. The method according to claim 1, wherein said processing comprises:
downconverting said plurality of radio frequency signals using quadrature mixing to give inphase and quadrature components;
filtering said inphase and quadrature components using a first bandpass filter bandwidth to give first bandpass filtered inphase and quadrature components; and
filtering said inphase and quadrature components using a second bandpass filter bandwidth, different from the first bandpass filter bandwidth, to give second bandpass filtered inphase and quadrature components.

10. The method according to claim 9, the method further comprising using a complex filter to perform at least one of the steps of:
filtering said inphase and quadrature components to give first bandpass filtered inphase and quadrature components using a first complex filter; and
filtering said inphase and quadrature components to give second bandpass filtered inphase and quadrature components using a second complex filter.

11. A receiver for receiving data transmitted via a combination of a plurality of radio frequency signals using carrier aggregation,
wherein each radio frequency signal occupies a respective band of a plurality of radio frequency bands, the plurality of radio frequency bands being arranged in two groups separated in frequency by a first frequency region, the first of the two groups occupying a wider frequency region than the second group, the receiver comprising:
a controller configured to determine a frequency that is offset from the centre of a band defined by outer edges of the frequency regions occupied by the two groups; and
a signal processor for processing said plurality of radio frequency signals using a local oscillator set to the determined frequency.

12. The receiver according to claim 11, wherein the first frequency region is not used for transmitting said data.

13. The receiver according to claim 11, wherein the first frequency region comprises a radio frequency band occupied by a radio frequency signal that is not aggregated with said plurality of radio frequency signals.

14. The receiver according to claim 11, wherein the controller is configured to determine a frequency within one quarter of the bandwidth of one of the plurality of radio frequency bands from a frequency mid-way between the centre of the frequency region occupied by the first group and the centre of the frequency region occupied by the second group.

15. The receiver according to claim 14, wherein the controller is configured to determine a frequency substantially mid-way between the centre of the frequency region occupied by the first group and the centre of the frequency region occupied by the second group.

16. The receiver according to claim 11, wherein the controller is configured to determine a frequency within one eighth of the bandwidth of one of the plurality of radio frequency bands from a frequency mid-way between the centre of the frequency region occupied by the first group and the centre of the frequency region occupied by the second group.

17. The receiver according to claim 11, wherein the controller is configured to determine the offset in dependence on a measurement of signal quality of at least one of the plurality of radio frequency signals.

18. The receiver according to claim 11, wherein said signal processor is configured to:
downconvert said plurality of radio frequency signals using quadrature mixing to give inphase and quadrature components;
filter said inphase and quadrature components using a first bandpass filter bandwidth to give first bandpass filtered inphase and quadrature components; and
filter said inphase and quadrature components using a second bandpass filter bandwidth, different from the first bandpass filter bandwidth, to give second bandpass filtered inphase and quadrature components.

19. The receiver according to claim 18, the receiver comprising at least one of:
a first complex filter configured to perform said filtering of said inphase and quadrature components to give first bandpass filtered inphase and quadrature components; and
a second complex filter configured to perform said filtering of said inphase and quadrature components to give second bandpass filtered inphase and quadrature components.

20. The receiver according to claim 18, the receiver being configured to:
downconvert the first subset of the downconverted plurality radio frequency signals from radio frequency bands in the first group;
downconvert the second subset of the downconverted plurality radio frequency signals from radio frequency bands in the second group;
receive a first subset of the downconverted plurality of radio frequency signals using the first bandpass filtered inphase and quadrature components; and
receive a second subset of the downconverted plurality of radio frequency signals using the second bandpass filtered inphase and quadrature components.

21. The receiver according to claim 20, wherein the receiver further comprises:
a plurality of analogue to digital converters configured to digitise the respective bandpass filtered inphase and quadrature components; and
at least a digital image reject mixer to downconvert the digitised respective bandpass filtered inphase and quadrature components.

* * * * *